United States Patent [19]

Buckley

[11] 4,096,387
[45] Jun. 20, 1978

[54] ULTRAVIOLET RADIATION DETECTOR

[75] Inventor: Robert Harling Buckley, Quebec, Canada

[73] Assignee: RCA Corporation, New York, N.Y.

[21] Appl. No.: 749,180

[22] Filed: Dec. 9, 1976

[51] Int. Cl.² ............................................. G01T 1/24
[52] U.S. Cl. .................................... 250/372; 250/370; 250/461 R
[58] Field of Search ............... 250/370, 371, 372, 458, 250/461

[56] References Cited

U.S. PATENT DOCUMENTS

| 2,885,562 | 5/1959 | Marinace et al. | 250/370 |
| 2,899,560 | 8/1959 | Nemet | 250/370 X |
| 3,743,835 | 7/1973 | Koncen | 250/370 X |
| 3,866,049 | 2/1975 | Allington | 250/372 X |
| 3,891,849 | 6/1975 | Felice et al. | 250/372 |

Primary Examiner—Archie R. Borchelt
Attorney, Agent, or Firm—H. Christoffersen; Birgit E. Morris

[57] ABSTRACT

A semiconductor body is used by the present invention in the detection of ultraviolet radiation. An antireflection layer is on a portion of a surface of said body with electrical contacting means on the remaining portion of the body. A phosphor layer is on the antireflection layer. The phosphor layer is capable of converting the ultraviolet radiation into visible or near infrared radiation which can be detected by the semiconductor body. On the phosphor layer is a metallic film which is substantially transmissive to ultraviolet radiation and substantially reflective to visible or near infrared radiation. The converted radiation in the phosphor layer which strikes the metallic flow may therefore be directed toward the semiconductor body for detection.

5 Claims, 1 Drawing Figure

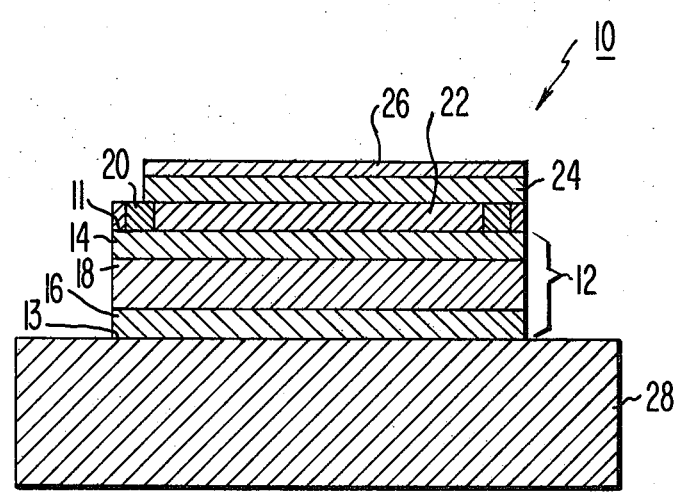

ULTRAVIOLET RADIATION DETECTOR

BACKGROUND OF THE INVENTION

The present invention relates to semiconductor photodetectors and more particularly to silicon photodetectors used for detecting ultraviolet radiation.

In the past ultraviolet (UV) detection by silicon photodiodes has met with many difficulties. A photodetector is a device which responds to radiant energy by generating carriers which are collected as current. As example of a photodetector is a photodiode.

In the ultraviolet region of the electromagnetic spectrum, i.e., 1,000 up to 4,000 angstroms (Å) wavelength, radiation absorption by silicon is very high, i.e., typically greater than $10^5$/cm, leading to complete attenuation of the ultraviolet radiation within about 1,000Å or less of the silicon body incident surface. If the UV generated carriers are to be detected they must diffuse to the depletion region of the photodiode where the electric field can sweep them across the junction for collection as current. Surface physics dictate that the properties of the silicon body near a surface decreases the lifetime of the carriers generated near that surface and increases the likelihood of recombination and trapping of these generated carriers. If the depletion region in the conventional silicon photodetector is extended all the way to the surface, noise and leakage current due to carrier injection are considerably enhanced. In addition, it is difficult to passivate the surfaces of silicon photodetectors if UV detection is contemplated, since the oxides of silicon which would be used as a passivation layer will themselves absorb ultraviolet radiation. Indeed, the surfaces of the silicon body will typically have to be left entirely exposed because all optical materials which might be used in hermetically passivating such a body are themselves absorbing in the ultraviolet radiation range. The same applies to antireflection coating materials so that an additional problem encountered is that there will be very high reflectivity of the silicon body in the UV radiation range and subsequent losses in detection sensitivity.

Furthermore, many conventional silicon ultraviolet detectors made by conventional diffusion techniques show degradation of performance with exposure to ultraviolet radiation. This problem is due to silicon damage which is occasioned by the high energy photons of ultraviolet radiation. Therefore, it would be most desirable in the silicon photodetector field if a silicon body could be modified for UV detection with the elimination of the problems of high reflectance, high noise, leakage current, degradation and environmental contamination.

SUMMARY OF THE INVENTION

An ultraviolet radiation detector includes a body of semiconductor material suitable for detecting radiation at a wavelength in the range of 4,000 to 12,000Å. An antireflection layer is on a surface of the body. On a surface of said antireflection layer is a phosphor layer. The phosphor layer is capable of converting radiation at a wavelength in the range of 1,000 to 3,999Å into radiation of a wavelength in the range of 4,000 to 12,000A. A metallic film is on a surface of the phosphor layer. The metallic film is substantially transmissive to radiation having a wavelength in the range of 1,000 to 3,999Å and substantially reflective to radiation at a wavelength in the range of 4,000 to 12,000Å.

BRIEF DESCRIPTION OF THE DRAWING

The FIGURE is a cross-sectional view of the UV radiation detector of the present invention.

DETAILED DESCRIPTION OF THE INVENTION

Referring to the FIGURE, the ultraviolet (UV) radiation detector of the present invention is designated as 10. The UV radiation detector 10 includes a body 12 of semiconductor material sensitive to electromagnetic radiation in the visible or near infrared range, i.e., 4,000 to 12,000Å wavelength. The body 12 has a first an second surface 11 and 13 which are substantially planar and opposite each other. The body 12 may be of any conventional semiconductor junction structure utilized for visible or infrared detection such as a PIN, bipolar, or Schottky barrier structure. However, for the purpose of describing the photodetector of the present invention it is assumed that the body 12 is of a PIN structure. Thus, the body 12 includes a first layer 14 of one conductivity type and a second layer 16 of an opposite conductivity type spaced from the first layer 14, with a third layer 18 of intrinsic semiconductor material spaced between and contiguous to both first and second layers 14 and 16. By "intrinsic" it is meant that the third layer 18 is of very low impurity concentration. For the purpose of describing the present invention it is assumed that the first layer 14 is of P type conductivity, the second layer 16 is of N type conductivity and the third layer 18 is of N⁻type conductivity.

Means for electrically contacting the first layer 14 are designated as 20. The contact means 20 can be a metallic electrode on a portion of the first surface 11 on the first layer 14 opposite the second layer 16, with the metallic electrode in the vicinity of the periphery of the first surface 11. Other contacting means well known to those in the art can also be used.

On the first surface 11, not occupied by the contact means 20, is an antireflection layer 22. An antireflection layer is a layer of material on a surface to reduce reflection and to increase the surface's transmission of electromagnetic radiation. The antireflection layer 22 is typically of dielectric material, e.g., silicon dioxide, cerium fluoride, or magnesium fluoride, having an index of refraction and thickness such that it is tuned to the radiation frequencies within the visible and near infrared spectral ranges. Specifically, the antireflection layer 22 is tuned to the frequency of the radiation which is incident on the semiconductor body 12.

On the antireflection layer 22 is a phosphor layer 24. The phosphor layer 24 will typically leave an opening on a small portion of the contact means 20 so that a wire lead (not shown) can make easy contact to the contact means 20. Typically, the phosphor layer 24 includes a phosphor which is either soluble in or finely dispersed within a host composition. As is well known to those in the art, a phosphor is a material which absorbs radiation at one portion of the spectral band and converts the absorbed radiation into emitted radiation at another portion of the spectral band. The phosphor utilized in the phosphor layer 24 must be capable of absorbing electromagnetic radiation in the UV range (1,000 to 3,999Å in wavelength) and capable of emitting radiation in the visible or infrared radiation range (4,000 to 12,000Å in wavelength). Typically, the phosphor is an organic material for purposes of high conversion efficiency, for example 2-(2-hydroxyphenyl)benzothiazole having the formula:

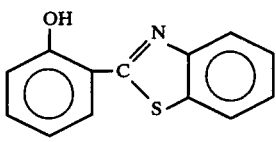

The host composition is a material which can either dissolve the phosphor employed or contain finely dispersed phosphor particles and also is essentially transparent to ultraviolet radiation. An example of a host composition meeting these requirements is cellulose acetate butyrate. Typically, the volume concentration of the phosphor in the host composition is in the range of 1 to 20%.

A metallic film 26 is on the phosphor layer 24. The metallic material and the thickness of metallic film 26 must be such that it provides substantially high transmission to radiation in the UV range and substantially high reflection to radiation in the visible or near infrared range. Typically, those skilled in the art can determine by conventional experimental procedures what the thickness of the metallic film 26 should be for metals such as silver, aluminum, or gold. Specifically, the thickness of metallic film 26 may be estimated theoretically by considering the effect of the metallic film 26 thickness and the surrounding media on the overall reflectivities of the film surfaces and the absorption of the metallic film 26. The solution to this problem is known in electromagnetic theory. The resulting expression for the overall reflectivity include the metallic film 26 thickness, and the real and imaginery parts of the complex refractive index as variables. The real and imaginery parts of the refractive index are generally known by experiment as a function of wavelength. Hence, for particular wavelength bands, the thickness may be chosen to achieve high or low reflectivity. For the metallic film 26, a compromise thickness is needed to maximize reflectivity in one wavelength band, i.e., in the 4,000 to 12,000Å band, and to minimize reflectivity in another, i.e., the 1,000 to 3,999Å band. Typically, the thickness of the metallic film 26 will be in the range of 50-200Å.

Means for electrically contacting the second layer 16 are designated as 28. The electrical contacting of the second layer 16 can be accomplished by mounting the body 12 onto a metallic header such that the header is contiguous to the second layer 16, although other conventional contacting means can also be utilized.

In the operation of the ultraviolet radiation detector 10, ultraviolet radiation is incident onto a surface of the metallic film 26 and is transmitted through the metallic film 26. The ultraviolet radiation then enters the phosphor layer 24 and at least part of the absorbed ultraviolet radiation is converted into radiation having a wavelength in the visible or near infrared range, i.e., 4,000 to 12,000Å. The radiation emitted from the phosphor layer 24 is emitted in all directions. Some of the emitted radiation is in the direction of the antireflection layer 22. However, that portion of the emitted radiation which is directed away from the antireflection layer 22 will be reflected back towards the antireflection layer 22 by the metallic film 26 which is reflective to visible and near infrared radiation. Thus, it is readily seen that the metallic film 26 serves the function of increasing the quantity of visible or near infrared radiation directed towards the antireflection layer 22 and subsequently the semiconductor body 12. Thus, by increasing the amount of radiation directed to the semiconductor body 12, the metallic film 26 increases the sensitivity in the ultraviolet radiation detector 10.

Typically, the presence of the antireflection layer 22 will double the quantum efficiency of the ultraviolet radiation detector 10 as a result of its reducing the reflection of radiation incident onto body 12. The antireflection layer 22 is tuned by methods well known to those skilled in the art, i.e., through controlling the thickness of the antireflection layer 22 and the index of refraction of the material of the antireflection layer 22 such that substantially all of the incident radiation can enter the semiconductor body 12 and not be reflected away.

The semiconductor body 12 can be operated in the photoconductive mode, i.e., biased, or in the photovoltaic mode, i.e., unbiased.

In the photoconductive mode the body 12 is reversed biased, such that it is typically fully depleted which implies that the depletion region and its accompanying electric field extend substantially through the thickness of the semiconductor body 12. The semiconductor body 12 is reversed biased, if, for example, the first layer 14 is of P type conductivity and the second layer 16 is of N type conductivity, by maintaining the contact means 20 at a negative potential with respect to the contact means 28, and vice versa. The thicker the semiconductor body 12, the larger the reverse bias voltage needed to accomplish full depletion. The radiation incident onto body 12 is absorbed by the semiconductor material which results in the generation of hole-electron carriers. The photogenerated carriers are then swept up and collected as current by the electric field of the depletion region.

If operated in the photovoltaic mode or unbiased mode, there is no voltage potential at the contact means 20 and 28. In the photovoltaic mode the depletion region will typically extend through only a portion of the third region 18. Naturally, the lessening of the depletion region reduces the probability of carrier collection i.e., a reduction in sensitivity. However, if the quality of the semiconductor material of the body 12 is high, the sensitivity of the device is reduced only to a small degree, i.e., 10 to 15%, since photogenerated can still diffuse through the body 12 to the depletion region. The collection of the photogenerated hole-electron carries by the electric field of the depletion regions, result in the generation of an electrical current of electrical signal from the photodetector 10.

Since only visible or near infrared radiation is incident onto the body 12, the photodetector 10 of the present invention is not associated with the difficulties previously described that arise when a silicon body is utilized directly for UV detection, e.g. high reflectance, high noise, leakage current and degradation of performance with time.

In the fabrication of the UV detector 10, the semiconductor body 12, which is typically of silicon, can be fabricated by conventional diffusion techniques. Conventionally, a body of intrinsic silicon is placed in a diffusion furnace and P type dopant is diffused in at one surface and N type dopant is diffused in at an opposite surface, thereby forming the first and second layers 14 and 16, and defining the third layer 18 of the body 12.

After the body 12 is formed, the contact means 20, i.e., the metallic electrode, is formed on the surface 11 of the body 12 by conventional masking and evaporation techniques. The antireflection layer 22, e.g., silicon dioxide, is then formed on the remainder of the surface 11 by standard evaporation techniques.

Next, the phosphor layer 24 is formed on the antireflection layer 22. Typically, the phosphor material and host composition of the phosphor layer 24 are commercially available in finely divided particle form. There are two approaches possible in the fabrication of the phosphor layer 24. The phosphor and the host composition may be mixed in the dry state, applied to a surface of the antireflection layer 22, and subsequently heated above the melting point of the host composition to cause the phosphor and the host composition to melt and flow across the antireflection layer 22, leaving a solid layer after the components have been cooled. The second approach is to dissolve both the phosphor and the host composition in a mutual solvent, such as acetone, alcohol, or chloroform, and to apply this solution to the antireflection layer 22 and evaporate the solvent. A portion of the phosphor layer 24 is conventionally etched so that a wire lead (not shown) can be connected to the contact means 20.

After forming the phosphor layer 24, the device is mounted on a contact means 28, e.g. a metallic header, so that second layer 16 is in direct contact with the contact means 28. The mounting is accomplished by soldering or by glueing using an electrically conductive epoxy. As previously stated, the header can act as an electrode to the second layer 16. The metallic film 26 is then formed on the phosphor layer 24 by conventional techniques of cold evaporation in a vacuum. In order to avoid the possibility of high resistance shorts between the contact means 20 and the header 28, it is preferable to evaporate the metallic film 26 through a conventional shadow mask.

The final assembly of the UV radiation detector 10 will typically involve encapsulating the detector 10 by placing a cap (not shown) having a window over the detector 10 and onto the contact means 28, i.e., the header. The cap is secured to the header by using an hermetic welded metal. Typically, the window in the cap will be of a fused quartz or similar material which is highly transmissive to UV radiation.

The UV radiation detector 10 of the present invention provides UV detection but without the accompanying problem of high leakage current, high noise, high reflection and environmental contamination that is found in many conventional UV radiation detectors.

I claim:

1. An ultraviolet radiation detector comprising:
    a silicon body of semiconductor material suitable for detecting radiation at a wavelength in the range of 4,000 to 12,000Å;
    an anitreflection layer on a surface of said silicon body;
    a phosphor layer on a surface of said antireflection layer, said phosphor layer being capable of converting radiation at a wavelength in the range of 1,000 to 3,999Å into radiation having a wavelength in the range of 4,000 1 to 12,000Å; and
    a metallic film on a surface of said phosphor layer, said metallic film being substantially transmissive to radiation having a wavelength in the range of 1,000 to 3,999Å and substantially reflective to radiation having a wavelength in the range of 4,000 to 12,000Å.

2. The ultraviolet radiation detector in accordance with claim 1 wherein said body comprises a first layer of one conductivity type, a second layer of an opposite conductivity type spaced from said first layer and a third layer of intrinsic conductivity type between and contiguous to both first and second layers.

3. The ultraviolet radiation detector in accordance with claim 2 having means for electrically contacting said first layer of said body.

4. The ultraviolet radiation detector in accordance with claim 3 wherein said means are a metallic electrode on said first layer.

5. The ultraviolet radiation detector in accordance with claim 4 having means for electrically contacting said second layer of said body.

* * * * *